United States Patent
YiN et al.

(10) Patent No.: US 10,897,268 B2
(45) Date of Patent: Jan. 19, 2021

(54) PROBABILITY-BASED SYNCHRONIZATION OF A SERIAL CODE STREAM

(71) Applicant: Cirrus Logic International Semiconductor Ltd., Edinburgh (GB)

(72) Inventors: Leyi YiN, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/795,045

(22) Filed: Feb. 19, 2020

(65) Prior Publication Data

US 2020/0274548 A1 Aug. 27, 2020

Related U.S. Application Data

(60) Provisional application No. 62/808,684, filed on Feb. 21, 2019.

(51) Int. Cl.
*H03M 7/00* (2006.01)
*H03M 7/36* (2006.01)
*H04L 29/06* (2006.01)
*H03M 7/30* (2006.01)

(52) U.S. Cl.
CPC ....... *H03M 7/3044* (2013.01); *H03M 7/6005* (2013.01); *H03M 7/6011* (2013.01); *H04L 65/607* (2013.01)

(58) Field of Classification Search
CPC .......... H03M 7/3044; H03M 7/6005; H03M 7/6011; H03M 7/6035; H04L 65/607

USPC .................. 341/50, 143, 51, 87, 66, 67, 107
See application file for complete search history.

(56) References Cited

U.S. PATENT DOCUMENTS

| | | | | |
|---|---|---|---|---|
| 6,512,884 B1* | 1/2003 | Sawada | ................ | H04N 9/8063 |
| | | | | 348/423.1 |
| 7,903,891 B2* | 3/2011 | Sugimoto | .............. | H04N 19/91 |
| | | | | 382/238 |
| 2004/0088633 A1* | 5/2004 | Lida | ...................... | H04L 1/0041 |
| | | | | 714/752 |

* cited by examiner

*Primary Examiner* — Peguy Jean Pierre
(74) *Attorney, Agent, or Firm* — Jackson Walker L.L.P.

(57) ABSTRACT

A system may include a modulator configured to generate a modulated data stream of samples from an input signal wherein each value of data in the modulated data stream when encoded is represented by a multi-bit code, wherein the modulator comprises a quantizer configured to quantize the modulated data stream from the input signal and feed back the modulated data stream as a feedback signal to an input of the modulator and a memory configured to store one or more samples of the modulated data stream. The system may also include an encoder configured to generate a synchronized serialized code stream from the modulated data stream. The quantizer may be configured to, based on the one or more samples of the modulated data stream stored in the memory, constrain the modulated data stream such that a synchronization state of the synchronized serialized code stream generated by the encoder is determinable based on the synchronized serialized code stream.

20 Claims, 2 Drawing Sheets

PROBABILITY-BASED SYNCHRONIZATION OF A SERIAL CODE STREAM

RELATED APPLICATION

The present disclosure claims priority to U.S. Provisional Patent Application Ser. No. 62/808,684, filed Feb. 21, 2019, which is incorporated by reference herein in its entirety.

FIELD OF DISCLOSURE

The present disclosure relates in general to data processing systems, and more particularly, to probability-based synchronization of a serial code stream.

BACKGROUND

In a data processing system, a data transmitter may include a modulator for converting data into a stream of modulated multi-bit data comprising multiple (more than two) quantization levels and a serializer for converting the stream of modulated data into a serialized code stream which may then be transmitted to a data receiver having a decoder for converting the code stream back into a stream of modulated data represented by multiple bits.

In order for the decoder to decode the code stream correctly, the code stream needs to be synchronized correctly by splitting the code stream into segments that can be decoded as modulated data. Known techniques for synchronization may include transporting the code stream as a payload of an interface protocol (e.g., High Definition Audio) that has its own synchronization stream, insertion of synchronization information between data codes, or embedding synchronization information into one or more of the data codes. However, such techniques may have disadvantages, as they may require extra transmission wires, higher clock rates, higher bandwidth, and/or creation of redundant codes.

SUMMARY

In accordance with the teachings of the present disclosure, certain disadvantages and problems associated with synchronization of modulated data may be reduced or eliminated.

In accordance with embodiments of the present disclosure, a system may include a modulator configured to generate a modulated data stream of samples from an input signal wherein each value of data in the modulated data stream when encoded is represented by a multi-bit code, wherein the modulator comprises a quantizer configured to quantize the modulated data stream from the input signal and feed back the modulated data stream as a feedback signal to an input of the modulator, and a memory configured to store one or more samples of the modulated data stream. The system may also include an encoder configured to generate a synchronized serialized code stream from the modulated data stream. The quantizer may be configured to, based on the one or more samples of the modulated data stream stored in the memory, constrain the modulated data stream such that a synchronization state of the synchronized serialized code stream generated by the encoder is determinable based on the synchronized serialized code stream.

In accordance with these and other embodiments of the present disclosure, a system may include a synchronizer configured to receive a serialized code stream constructed from a first modulated data stream of samples wherein each value of data in the first modulated data stream when encoded is represented by a multi-bit code, wherein the first modulated data stream comprises one of a first type of stream with a first probability and a second type of stream with a second probability and the first probability is maximized and the second probability is minimized. The synchronizer may also be configured to select a synchronization of the serialized code stream such that when the serialized code stream is decoded into a second modulated data stream, the occurrence of the second type of stream in the second modulated data stream of samples is minimized. The system may also include a decoder configured to, in accordance with the synchronization selected by the synchronizer, decode the serialized code stream into the second modulated data stream.

In accordance with these and other embodiments of the present disclosure, a method may include generating a modulated data stream of samples, with a quantizer integral to a modulator, from an input signal wherein each value of data in the modulated data stream when encoded is represented by a multi-bit code, feeding back the modulated data stream to an input of the modulator, storing one or more samples of the modulated data stream in a memory, and encoding the modulated data stream to generate a synchronized serialized code stream. Generating the modulated data stream may include, based on the one or more samples of the modulated data stream stored in the memory, constraining, by the quantizer, the modulated data stream such that a synchronization state of the synchronized serialized code stream generated by an encoder is determinable based on the synchronized serialized code stream.

In accordance with these and other embodiments of the present disclosure, a method may include receiving a serialized code stream constructed from a first modulated data stream of samples wherein each value of data in the first modulated data stream when encoded is represented by a multi-bit code, and wherein the first modulated data stream comprises one of a first type of stream with a first probability and a second type of stream with a second probability and the first probability is maximized and the second probability is minimized. The method may also include selecting a synchronization of the serialized code stream such that when the serialized code stream is decoded into a second modulated data stream, the occurrence of the second type of stream in the second modulated data stream of samples is minimized. The method may further include decoding the serialized code stream into the second modulated data stream in accordance with the synchronization selected by the synchronizer.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
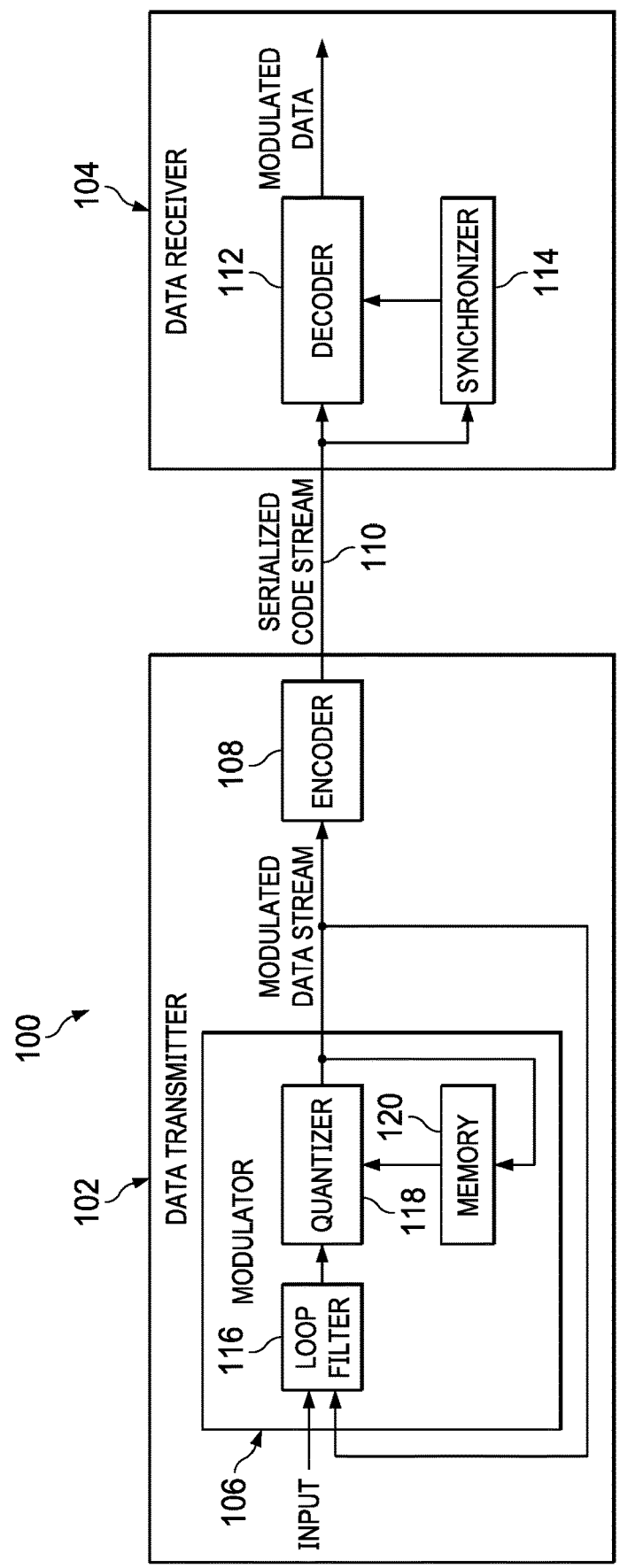
FIG. 1 illustrates a block diagram of selected components of an example data processing system, in accordance with embodiments of the present disclosure.

FIG. 1 illustrates a block diagram of selected components of an example data processing system 100, in accordance with embodiments of the disclosure. As shown in FIG. 1, data processing system 100 may include a data transmitter 102, a data receiver 104, and a data bus 110.

Data transmitter 102 may comprise any suitable system, device, or apparatus configured to process an input signal INPUT to generate a digital serialized code stream for communication over data bus 110. For example, data transmitter 102 may comprise a microprocessor, microcontroller, digital signal processor (DSP), application specific integrated circuit (ASIC), or any other device configured to interpret and/or execute program instructions and/or process data, such as a digital audio output signal. Data transmitter 102 may include a modulator 106 (e.g., a delta-sigma modulator) configured to convert input signal INPUT into a modulated data stream wherein each item of data in the data stream requires a plurality of bits to represent.

As depicted in FIG. 1, modulator 106 may comprise a loop filter 116, quantizer 118, and memory 120. Loop filter 116 may include an input summer (not shown) for generating an error signal equal to a difference between input signal INPUT and the modulated data stream fed back from the output of quantizer 118, and may also comprise one or more filter (e.g., integrator) stages (not shown), such that loop filter 116 operates as a filter of the error signal to generate a filtered input signal to quantizer 118 based on input signal INPUT and the modulated data stream generated by quantizer 118.

Quantizer 118 may comprise any system, device, or apparatus configured to receive input signal INPUT as filtered by loop filter 116, and quantize the filtered input signal into the modulated data stream wherein each item of data in the data stream requires a plurality of bits to represent. For example, input signal INPUT may comprise a 16-bit signal while the modulated data stream generated by quantizer 118 may comprise a two-bit signal.

Memory 120 may comprise any system, device, or apparatus configured to store one or more samples of the modulated data stream generated by quantizer 118. As shown in FIG. 1, memory 120 may also be read-accessible to quantizer 118, such that, as described in greater detail below, quantizer 118 may be responsive to samples of the modulated data stream stored in memory 120 in order to constrain the modulated data stream so that a synchronization state of a serialized code stream generated by encoder 108 may be indirectly estimated or determined (e.g., by data receiver 104) from the serialized code stream itself without the need for communication of control or synchronization bits from data transmitter 102 to data receiver 104.

Data transmitter 102 may also include an encoder 108 configured to convert the multibit modulated data into a serialized code stream for communication over data bus 110. For example, encoder 108 may convert a modulated data stream comprising two-bit codes generated by modulator 106 into a serialized bit stream.

Data bus 110 may comprise any suitable wired or wireless medium for transmission of a serialized code stream from data transmitter 102 to data receiver 104.

Data receiver 104 may comprise any suitable system, device, or apparatus configured to process the serialized code stream communicated over data bus 110. For example, data receiver 104 may comprise a microprocessor, microcontroller, digital signal processor (DSP), application specific integrated circuit (ASIC), or any other device configured to interpret and/or execute program instructions and/or process data, such as a digital audio output signal. As shown in FIG. 1, data receiver 104 may include a synchronizer 114 configured to synchronize the serialized code stream communicated over data bus 110, as described in greater detail below. Data receiver 104 may also include a decoder 112 configured to decode the serialized code stream received over data bus 110 into modulated data identical to or otherwise equivalent to the modulated data generated by modulator 106. After such conversion back into modulated data, data receiver 104 or another component of data processing system 100 may further process the data.

In operation, modulator 106 may be configured to generate a modulated data stream wherein each item of data in the data stream when encoded by encoder 108 is represented by a multi-bit code, wherein quantizer 118 of modulator 106 may further constrain its output to maximize a first probability of a first sequence of values and minimize a second probability of a second sequence of values in a manner such that a significant difference (e.g., at least one order of magnitude) exists between the first probability and the second probability. In some embodiments, the second probability may be zero. Accordingly, modulator 106 may generate the modulated data stream such that the modulated data stream comprises one of a first type of stream with a first probability and a second type of stream with a second probability and wherein the first probability is maximized and the second probability is minimized. In so maximizing the first probability and minimizing the second probability, quantizer 118 may constrain its output, such that a synchronization state of a serialized code stream generated by encoder 108 may be indirectly estimated or determined (e.g., by data receiver 104) from the serialized code stream itself without the need for communication of control or synchronization bits from data transmitter 102 to data receiver 104.

In turn, encoder 108 may encode the modulated data stream into a serialized code stream for communication over data bus 110. Such encoding may create a serialized code stream such that if the serialized code stream were correctly synchronized by decoder 112, the serialized code stream would correspond to the first sequence of values, and if the serialized code stream were not correctly synchronized by decoder 112, the serialized code stream would correspond to the second sequence of values.

Synchronizer 114 may receive the serialized code stream from data bus 110 and select a synchronization of the serialized code stream such that when the serialized code stream is decoded into a modulated data stream by decoder 112, the occurrence of the second sequence of values in the modulated data stream of samples is minimized, and thus the presence of the second type of stream in the decoded modulated data stream.

Decoder 112 may receive the serialized code stream from data bus 110 and, in accordance with the synchronization selected by synchronizer 114, decode the serialized code stream into a modulated data stream of values.

Some non-limiting examples may further illustrate the functionality of modulator 106, encoder 108, synchronizer 114, and decoder 112 described above. In accordance with one non-limiting example, modulator 106 may be configured to modulate input signal INPUT into a modulated data stream of samples having four possible values: −2, −1, +1, and +2, and encoder 108 may be configured to encode these values into digital codes 00, 01, 10, and 11, respectively. However, quantizer 118 of modulator 106 may, responsive to one or more historical values of the modulated data stream stored in memory 120, be configured to constrain its output such that a small (e.g., zero) probability exists of either of the sequences of values for {+2, −2, +2} and {−2, +2, −2} occurring. Thus, if synchronizer 114 receives the serialized code stream x110011x, where "x" corresponds to a "don't care" or "wild card" bit that can be either 1 or 0, synchronizer 114 has a first option of synchronizing two-bit codes of the serialized code stream as {11, 00, 11} corresponding to decoded values of {+2, −2, +2} or a second option of synchronizing two-bit codes of the serialized code stream as {x1, 10, 01, 1x} corresponding to decoded values of {−1/+2, +1, −1, +1/+2}. Because a sequence of decoded sample values {+2, −2, +2} corresponds to a low-probability sequence of values that is to be generated by modulator 106, synchronizer 114 may choose the second option. Similarly, if synchronizer 114 receives the serialized code stream x001100x, where "x" corresponds to a "don't care" or "wild card" value that can be either 1 or 0, synchronizer 114 has a first option of synchronizing two-bit codes of the serialized code stream as {00, 11, 00} corresponding to decoded sample values of {−2, +2, −2} or a second option of synchronizing two-bit codes of the serialized code stream as {x0, 01, 10, 0x} corresponding to decoded sample values of {−2/+1, −1, +1, −2/−1}. Because a sequence of decoded sample values {−2, +2, −2} corresponds to a low-probability sequence that is to be generated by modulator 106, synchronizer 114 may choose the second option.

In another example using the same quantization scheme, quantizer 118 may be configured to, based on historical samples of the modulated data stream, "overrule" a value that quantizer 118 would otherwise generate in response to the output of loop filter 116. To illustrate, under the quantization scheme, an output stream from loop filter 116 may be such that quantizer 118 would, in absence of historical samples stored in memory 120, generate a sequence of {11, 00, 11} corresponding to decoded values of {+2, −2, +2}. However, using historical data in memory 120, quantizer 118 may instead generate a sequence of {11, 00, 10} corresponding to decoded values of {+2, −2, +1}. To further illustrate, under the quantization scheme, an output stream from loop filter 116 may be such that quantizer 118 would, in absence of historical samples stored in memory 120, generate a sequence of {00, 11, 00} corresponding to decoded values of {−2, +2, −2}. However, using historical data in memory 120, quantizer 118 may instead generate a sequence of {00, 11, 01} corresponding to decoded values of {−2, +2, −1}. In each case, any such replacement value generated by quantizer 118 may be fed back to the input of loop filter 116.

In accordance with another non-limiting example, modulator 106 may be configured to modulate input signal INPUT into a modulated data stream of samples having five possible values: −2, −1, 0, +1, and +2 which represent a differential transition between successive samples of input signal INPUT, and encoder 108 may be configured to encode these values into digital codes 10, 11, 01, 00, and 10, respectively, where "10" is decoded as +2 if the previous non-zero differential value is negative and is decoded as −2 if the previous non-zero differential value is positive. However, quantizer 118 of modulator 106 may, responsive to one or more historical values of the modulated data stream stored in memory 120, be configured to constrain its output such that a small (or zero) probability exists of either of the sequences of values {+2, −2} and {−2, +2} occurring. Thus, if synchronizer 114 receives the serialized code stream x1010x, where "x" corresponds to a "don't care" or "wild card" bit that can be either 1 or 0, synchronizer 114 has a first option of synchronizing two-bit codes of the serialized code stream as {10, 10} corresponding to decoded sample values of {+2, −2} or {−2, +2} or a second option of synchronizing two-bit codes of the serialized code stream as {x1, 01, 0x} corresponding to decoded sample values of {0/−1, 0, +1/0}. Because sequences of decoded sample values {+2, −2} and {−2, +2} both correspond to low-probability sequences that are to be generated by modulator 106, synchronizer 114 may choose the second option.

In another example using the same quantization scheme, quantizer 118 may be configured to, based on historical samples of the modulated data stream, "overrule" a value that quantizer 118 would otherwise generate in response to the output of loop filter 116. To illustrate, under the quantization scheme, an output stream from loop filter 116 may be such that quantizer 118 would, in absence of historical samples stored in memory 120, generate a sequence of {10, 10} corresponding to decoded values of {+2, −2} or {−2, +2}. However, using historical data in memory 120, quantizer 118 may instead generate a sequence of {10, 11} corresponding to decoded values of {+2, −1} or a sequence of {10, 00} corresponding to decoded values of {−2, +1}. In each case, any such replacement value generated by quantizer 118 may be fed back to the input of loop filter 116.

Figure 2:
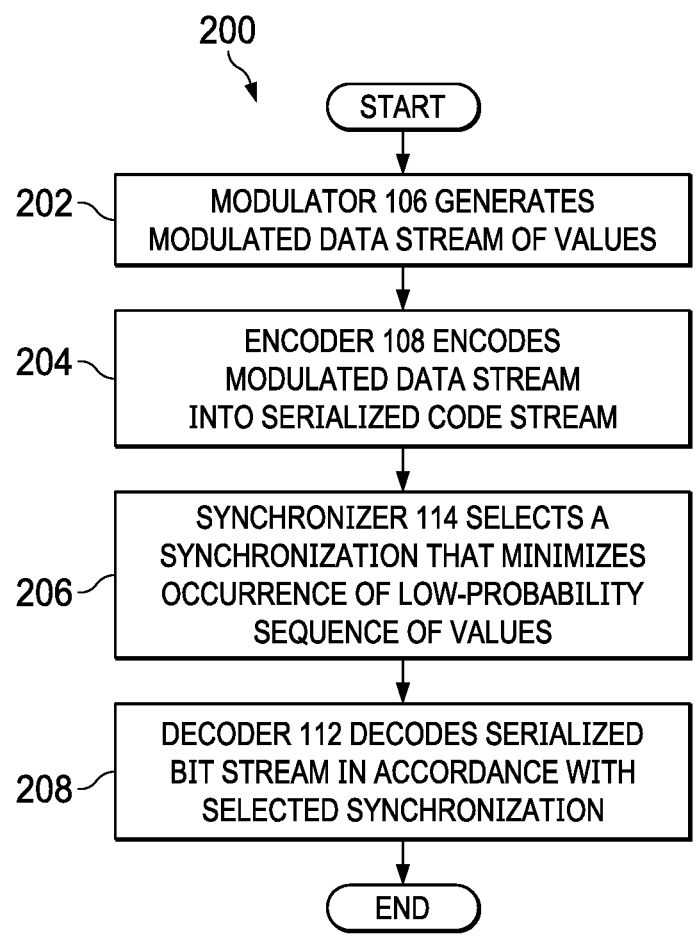
FIG. 2 illustrates a flow chart of an example method for probability-based synchronization of multi-bit data in a serial code stream, in accordance with embodiments of the present disclosure.

FIG. 2 illustrates a flow chart of an example method 200 for probability-based synchronization of multi-bit data in a serial code stream, in accordance with embodiments of the present disclosure. According to certain embodiments, method 200 may begin at step 202. As noted above, teachings of the present disclosure may be implemented in a variety of configurations of data processing system 100. As such, the preferred initialization point for method 200 and the order of the steps comprising method 200 may depend on the implementation chosen. In these and other embodiments, method 200 may be implemented as firmware, software, applications, functions, libraries, or other instructions.

At step 202, modulator 106 may receive input signal INPUT and generate a modulated data stream wherein each item of data in the data stream when encoded by encoder 108 is represented by a multi-bit code, wherein modulator 106 may further constrain its output to maximize a first probability of a first sequence of values and minimize a second probability of a second sequence of values in a manner such that a significant difference (e.g., at least one order of magnitude) exists between the first probability and the second probability. In some embodiments, the second probability may be zero. Accordingly, modulator 106 may generate the modulated data stream such that the modulated data stream comprises one of a first type of stream with a first probability and a second type of stream with a second probability and wherein the first probability is maximized and the second probability is minimized.

At step 204, encoder 108 may encode the modulated data stream into a serialized code stream for communication over data bus 110. Such encoding may create a serialized code stream such that if the serialized code stream were correctly synchronized by decoder 112, the serialized code stream would correspond to the first sequence of values, and if the serialized code stream were not correctly synchronized by decoder 112, the serialized code stream would correspond to the second sequence of values. In other words, quantizer 118 of modulator 106 may, responsive to one or more historical values of the modulated data stream stored in memory 120, be configured to constrain its output, such that a synchronization state of a serialized code stream generated by encoder 108 may be indirectly estimated or determined (e.g., by data receiver 104) from the serialized code stream itself without the need for communication of control or synchronization bits from data transmitter 102 to data receiver 104.

At step 206, synchronizer 114 may receive the serialized code stream from data bus 110 and select a synchronization of the serialized code stream such that when the serialized code stream is decoded into a modulated data stream by decoder 112, the occurrence of the second sequence of values in the modulated data stream of samples is minimized, and thus the presence of the second type of stream in the decoded modulated data stream may be minimized.

At step 208, decoder 112 may receive the serialized code stream from data bus 110 and, in accordance with the synchronization selected by synchronizer 114, decode the serialized code stream into a modulated data stream of values.

Although FIG. 2 discloses a particular number of steps to be taken with respect to method 200, method 200 may be executed with greater or fewer steps than those depicted in FIG. 2. In addition, although FIG. 2 discloses a certain order of steps to be taken with respect to method 200, the steps comprising method 200 may be completed in any suitable order.

Method 200 may be implemented using data processing system 100, components thereof or any other system operable to implement method 200. In certain embodiments, method 200 may be implemented partially or fully in software and/or firmware embodied in computer-readable media.

The systems and methods disclosed herein may provide improvements over existing synchronization techniques. For example, using existing synchronization techniques, when encoding with two-bit codes, at least one of the four available codes is often used for synchronization. However, using the systems and methods disclosed herein, all four codes would be available for data, thus potentially increasing bandwidth.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
a modulator configured to generate a modulated data stream of samples from an input signal wherein each value of data in the modulated data stream when encoded is represented by a multi-bit code, wherein the modulator comprises:
a quantizer configured to quantize the modulated data stream from the input signal and feed back the modulated data stream as a feedback signal to an input of the modulator; and
a memory configured to store one or more samples of the modulated data stream; and
an encoder configured to generate a synchronized serialized code stream from the modulated data stream;
wherein the quantizer is configured to, based on the one or more samples of the modulated data stream stored in the memory, constrain the modulated data stream such that a synchronization state of the synchronized serialized code stream generated by the encoder is determinable based on the synchronized serialized code stream.

2. The system of claim 1, wherein:
the modulated data stream comprises one of a first type of stream with a first probability and a second type of stream with a second probability; and the quantizer is configured to generate the modulated data stream such that the first probability is maximized and the second probability is minimized.

3. The system of claim 2, wherein a significant difference exists between the first probability and the second probability.

4. The system of claim 3, wherein the significant difference is at least one order of magnitude.

5. The system of claim 2, wherein the second probability is zero.

6. The system of claim 2, wherein the encoding of the modulated data stream of samples into the serialized code stream creates the serialized code stream such that if the serialized code stream were correctly synchronized for decoding, the serialized code stream would correspond to the first type of stream, and if the serialized code stream were not correctly synchronized for decoding, the serialized code stream would correspond to the second type of stream.

7. A system comprising:
a synchronizer configured to:
receive a serialized code stream constructed from a first modulated data stream of samples wherein each value of data in the first modulated data stream when encoded is represented by a multi-bit code, and wherein:
the first modulated data stream comprises one of a first type of stream with a first probability and a second type of stream with a second probability; and
the first probability is maximized and the second probability is minimized;
select a synchronization of the serialized code stream such that when the serialized code stream is decoded into a second modulated data stream, the occurrence of the second type of stream in the second modulated data stream of samples is minimized; and
a decoder configured to, in accordance with the synchronization selected by the synchronizer, decode the serialized code stream into the second modulated data stream.

8. The system of claim 7, wherein a significant difference exists between the first probability and the second probability.

9. The system of claim 8, wherein the significant difference is at least one order of magnitude.

10. The system of claim 7, wherein the second probability is zero.

11. A method comprising:
generating a modulated data stream of samples, with a quantizer integral to a modulator, from an input signal wherein each value of data in the modulated data stream when encoded is represented by a multi-bit code;
feeding back the modulated data stream to an input of the modulator;
storing one or more samples of the modulated data stream in a memory; and
encoding the modulated data stream to generate a synchronized serialized code stream;
wherein generating the modulated data stream comprises, based on the one or more samples of the modulated data stream stored in the memory, constraining, by the quantizer, the modulated data stream such that a synchronization state of the synchronized serialized code stream generated by an encoder is determinable based on the synchronized serialized code stream.

12. The method of claim 11, wherein:
the modulated data stream comprises one of a first type of stream with a first probability and a second type of stream with a second probability; and
the quantizer is configured to generate the modulated data stream such that the first probability is maximized and the second probability is minimized.

13. The method of claim 12, wherein a significant difference exists between the first probability and the second probability.

14. The method of claim 13, wherein the significant difference is at least one order of magnitude.

15. The method of claim 12, wherein the second probability is zero.

16. The method of claim 12, wherein the encoding of the modulated data stream of samples into the serialized code stream creates the serialized code stream such that if the serialized code stream were correctly synchronized for decoding, the serialized code stream would correspond to the first type of stream, and if the serialized code stream were not correctly synchronized for decoding, the serialized code stream would correspond to the second type of stream.

17. A method comprising:
receiving a serialized code stream constructed from a first modulated data stream of samples wherein each value of data in the first modulated data stream when encoded is represented by a multi-bit code, and wherein:
the first modulated data stream comprises one of a first type of stream with a first probability and a second type of stream with a second probability; and
the first probability is maximized and the second probability is minimized;
selecting a synchronization of the serialized code stream such that when the serialized code stream is decoded into a second modulated data stream, the occurrence of the second type of stream in the second modulated data stream of samples is minimized; and
in accordance with the synchronization selected by the synchronizer, decoding the serialized code stream into the second modulated data stream.

18. The method of claim 17, wherein a significant difference exists between the first probability and the second probability.

19. The method of claim 18, wherein the significant difference is at least one order of magnitude.

20. The method of claim 17, wherein the second probability is zero.

* * * * *